(12) United States Patent
Choi et al.

(10) Patent No.: US 12,394,470 B2
(45) Date of Patent: Aug. 19, 2025

(54) SEMICONDUCTOR CHIP CAPABLE OF CALIBRATING BIAS VOLTAGE SUPPLIED TO WRITE CLOCK BUFFER REGARDLESS OF PROCESS VARIATION AND TEMPERATURE VARIATION, AND DEVICES INCLUDING THE SAME

(71) Applicant: SAMSUNG ELECTRONICS CO., LTD., Suwon-si (KR)

(72) Inventors: Garam Choi, Suwon-si (KR); Yonghun Kim, Suwon-si (KR); Jaewoo Lee, Suwon-si (KR); Kihan Kim, Suwon-si (KR); Hojun Chang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 216 days.

(21) Appl. No.: 18/221,598

(22) Filed: Jul. 13, 2023

(65) Prior Publication Data

US 2024/0119997 A1 Apr. 11, 2024

(30) Foreign Application Priority Data

Oct. 6, 2022 (KR) ...................... 10-2022-01279874

(51) Int. Cl.
*G11C 11/00* (2006.01)
*G11C 11/4074* (2006.01)
(Continued)

(52) U.S. Cl.
CPC ...... *G11C 11/4093* (2013.01); *G11C 11/4074* (2013.01); *G11C 11/4076* (2013.01)

(58) Field of Classification Search
CPC ............ G11C 29/028; G11C 29/50008; G11C 11/4093; G11C 2207/2254; G11C 7/1057; G11C 11/4085; G11C 29/025; G11C 29/022; G11C 2207/105; G11C 11/4096; G11C 7/1051; G11C 7/1048; G11C 11/4074; G11C 11/4076; G11C 11/4082; G11C 11/4099; G11C 29/021;
(Continued)

(56) References Cited

U.S. PATENT DOCUMENTS 7,064,601 B2  6/2006  Kwak et al.
7,791,959 B2  9/2010  Chun
(Continued)

FOREIGN PATENT DOCUMENTS

KR  10-2014-0130779 A  11/2014
KR  10-2015-0002203 A  1/2015

*Primary Examiner* — Thong Q Le
(74) *Attorney, Agent, or Firm* — Sughrue Mion, PLLC

(57) ABSTRACT

A semiconductor chip includes a write clock buffer, a voltage regulator, a process calibration circuit and a temperature calibration circuit. The voltage regulator generates plural regulated voltages. The process calibration circuit output one of the regulated voltages as a bias voltage of the write clock buffer, depending on a process variation of the semiconductor chip. The temperature calibration circuit track a temperature variation of the semiconductor chip in real time, performs analog calibration on the bias voltage from the process calibration circuit in real time depending on a result of the tracking, and outputs the analog-calibrated bias voltage to the write clock buffer.

20 Claims, 7 Drawing Sheets

(51) Int. Cl.
*G11C 11/4076* (2006.01)
*G11C 11/4093* (2006.01)

(58) Field of Classification Search
CPC .......... G11C 7/1078; G11C 7/12; G11C 7/22;
G11C 7/1066; G11C 29/12005; G11C
29/1201; G11C 5/147; G11C 11/4091;
G11C 7/10; G11C 11/4094; G11C
13/0064; G11C 13/0069; G11C 16/0483;
G11C 16/06; G11C 16/20; G11C 16/32;
G11C 2029/0409; G11C 2029/5002;
G11C 2029/5004; G11C 2029/5602;
G11C 29/023; G11C 29/12; G11C
29/12015; G11C 29/16; G11C 29/20;
G11C 29/24; G11C 29/46; G11C
29/56012; G11C 7/02; G11C 7/1084;
G11C 8/08; G11C 8/14; G11C 29/02;
G11C 7/04; G11C 7/1069; H03K
19/0005; H03K 19/017545
USPC .................................................. 365/189.16
See application file for complete search history.

(56) References Cited

U.S. PATENT DOCUMENTS

| | | |
|---|---|---|
| 9,461,539 B2 | 10/2016 | Chern et al. |
| 11,145,355 B2 * | 10/2021 | Kim ................... G11C 7/1051 |
| 11,283,404 B1 | 3/2022 | Lim |
| 2013/0147544 A1 | 6/2013 | Kim et al. |

* cited by examiner

SEMICONDUCTOR CHIP CAPABLE OF CALIBRATING BIAS VOLTAGE SUPPLIED TO WRITE CLOCK BUFFER REGARDLESS OF PROCESS VARIATION AND TEMPERATURE VARIATION, AND DEVICES INCLUDING THE SAME

CROSS-REFERENCE TO RELATED APPLICATIONS

This application claims priority under 35 U.S.C. § 119 to Korean Patent Application No. 10-2022-0127987 filed on Oct. 6, 2022, in the Korean Intellectual Property Office, the disclosure of which being incorporated by reference herein in its entirety.

BACKGROUND

The present disclosure relates to a semiconductor chip, and more particularly, to a semiconductor chip capable of calibrating a bias voltage of a write clock buffer regardless of a process variation and a temperature variation, and devices including the same. That is, the semiconductor chip is capable of compensating a bias voltage of a write clock buffer to account for a process variation and a temperature variation.

The term "PVT variations" is an acronym for a process variation, a voltage variation, and a temperature variation.

The process variation refers to a phenomenon in which a speed of a PMOS transistor and a speed of an NMOS transistor are different due to process characteristics. The speed of the PMOS transistor is expressed by one of "fast", "typical", and "slow", and the speed of the NMOS transistor is expressed by one of "fast", "typical", and "slow". In this case, an NMOS transistor-PMOS transistor combination is mainly expressed by Fast-Fast (FF), Fast-Slow (FS), Typical-Typical (TT), Slow-Fast (SF), or Slow-Slow (SS).

The temperature variation refers to a phenomenon in which the speed of the PMOS transistor and the speed of the NMOS transistor change depending on a temperature. The voltage variation refers to a phenomenon in which the speed of the PMOS transistor and the speed of the NMOS transistor change depending on a supply voltage. As a result, a voltage and a current of each of semiconductor chips formed on the same semiconductor wafer vary depending on the PVT variations.

SUMMARY

It is an aspect to provide a semiconductor chip including a bias circuit capable of performing digital calibration on a bias voltage supplied to a write clock buffer regardless of a process variation (or a process variation and a temperature variation) and then performing analog calibration on the digitally calibrated bias voltage regardless of a temperature variation, and devices including the same. That is, the semiconductor chip includes the bias circuit that is capable of compensating a bias voltage of a write clock buffer to account for a process variation and a temperature variation.

According to an aspect of one or more embodiments, a semiconductor chip may comprise a write clock buffer; a voltage regulator configured to generate a plurality of regulated voltages; a process calibration circuit configured to output one of the plurality of regulated voltages as a bias voltage of the write clock buffer, depending on a process variation of the semiconductor chip; and a temperature calibration circuit configured to track a temperature variation of the semiconductor chip in real time, perform analog calibration on the bias voltage from the process calibration circuit in real time depending on a result of the tracking, and output the analog-calibrated bias voltage to the write clock buffer.

According to another aspect of one or more embodiments, a memory device may comprise a bias circuit configured to generate a bias voltage; and a write clock buffer configured to buffer complementary write clock signals based on the bias voltage and generate buffered complementary write clock signals. The bias circuit may comprise a voltage regulator configured to generate a plurality of regulated voltages; a process calibration circuit configured to output one of the plurality of regulated voltages as the bias voltage to the write clock buffer, depending on a process variation of the memory device; and a temperature calibration circuit configured to track a temperature variation of the memory device in real time, perform analog calibration on the bias voltage from the process calibration circuit in real time depending on a result of the tracking, and output the analog-calibrated bias voltage to the write clock buffer.

According to yet another aspect of one or more embodiments, a memory system may comprise a memory device; and a system on chip configured to control an operation of the memory device. The memory device may comprise a bias circuit configured to generate a bias voltage; and a write clock buffer configured to buffer complementary write clock signals by using the bias voltage and generate buffered complementary write clock signals. The bias circuit may comprise a voltage regulator configured to generate a plurality of regulated voltages; a process calibration circuit configured to output one of the plurality of regulated voltages as the bias voltage to the write clock buffer, depending on a process variation of the memory device; and a temperature calibration circuit configured to track a temperature variation of the memory device in real time, perform analog calibration on the bias voltage from the process calibration circuit in real time depending on a result of the tracking, and output the analog-calibrated bias voltage to the write clock buffer.

BRIEF DESCRIPTION OF THE FIGURES

The above and other aspects will become apparent by describing in detail embodiments thereof with reference to the accompanying drawings, in which.

DETAILED DESCRIPTION

Figure 1:
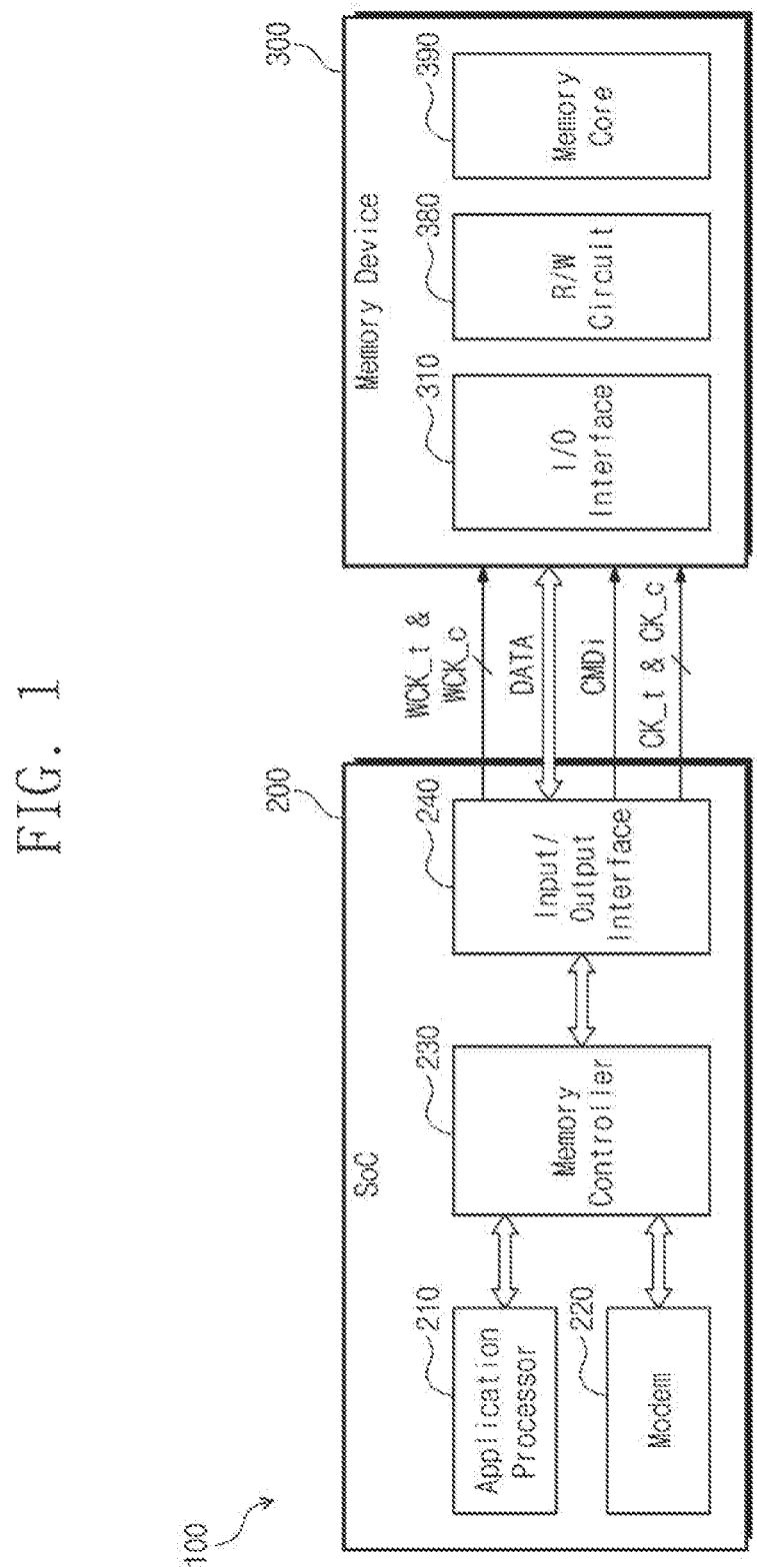
FIG. 1 is a block diagram of a memory system including a memory device according to some embodiments.

FIG. 1 is a block diagram of a memory system including a memory device according to some embodiments. Referring to FIG. 1, a memory system 100 may include a system on chip (SoC) 200 and a memory device 300.

In some embodiments, the memory system 100 may be a mobile device, and the mobile device may be a smartphone, a laptop computer, an Internet of Things (IoT) device, or a wearable computer. In some embodiments, the memory system 100 may be a personal computer (PC) such as a desktop computer.

The SoC 200 may include an application processor 210, a modem 220, a memory controller 230, and an input/output interface 240.

The application processor 210 may control operations of the modem 220 and the memory controller 230. Under control of the application processor 210, the memory controller 230 may write data "DATA" in the memory device 300 through the input/output interface 240 and may read the data "DATA" stored in the memory device 300 through the input/output interface 240.

The modem 220 may exchange wireless signals with any other memory system through wireless communication, and data corresponding to the wireless signals may be transferred to the application processor 210 or may be transferred from application processor 210.

The input/output interface 240 may be a physical layer (called "PHY") of an OSI (Open Systems Interconnection) model, and the PHY means circuitry to implement to physical layer functions.

The memory device 300 may be an integrated circuit (IC), a semiconductor chip (or a memory chip), or a semiconductor package including the semiconductor chip (or the memory chip). The memory device 300 may be a mobile DDR (Double Data Rate) DRAM or a low-power DDR (LPDDR) DRAM. The LPDDR DRAM is also called LPDDR SDRAM (Synchronous Dynamic Random Access Memory).

According to an embodiment, the SoC 200 and the memory device 300 may respectively include the input/output interface 240 and an input/output (I/O) interface 310 that comply with the LPDDR5 specification.

When the memory device 300 is the LPDDR5 DRAM, the memory controller 230 may be an LPDDR5 controller, and the input/output interface 240 may be an LPDDR5 PHY.

The input/output interface 240 sends complementary write clock signals WCK_t and WCK_c, a command CMDi (i being a natural number), the data "DATA", and complementary clock signals CK_t and CK_c to the memory device 300.

The memory device 300 includes the input/output (I/O) interface 310, a write/read (R/W) circuit 380, and a memory core 390. For example, in some embodiments, the memory core 390 may be a DRAM core.

Figure 2:
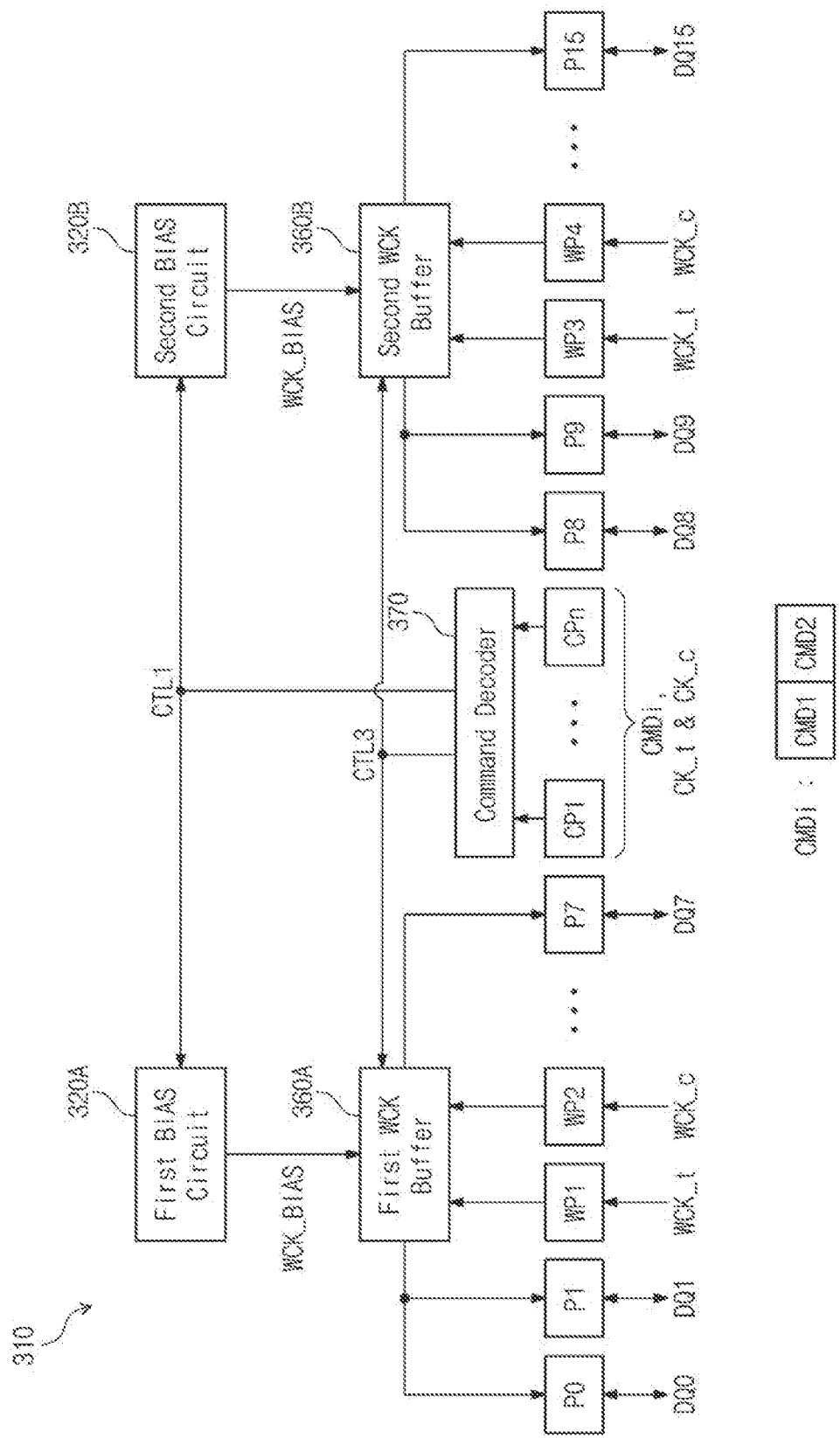
FIG. 2 is a diagram illustrating an input/output interface of a memory device of FIG. 1 in detail, according to some embodiments.

FIG. 2 is a diagram illustrating an input/output (I/O) interface 310 of the memory device 300 of FIG. 1 in detail, according to some embodiments. Referring to FIG. 2, the input/output interface 310 may include a first bias circuit 320A, a second bias circuit 320B, a first write clock (WCK) buffer 360A, a second write clock (WCK) buffer 360B, a command decoder 370, and a plurality of pads P0 to P15, WP1 to WP4, and CP1 to CPn.

Referring to FIGS. 1 and 2, depending on a second command CMDi (i=2) indicating a write operation or a read operation, the first and second write clock buffers 360A and 360B of the input/output interface 310 receive and buffer the complementary write clock signals WCK_t and WCK_c and output the buffered complementary write clock signals to the pads P0 to P15. In this case, the pads P0 to P15 are bidirectional input/output pads (or bidirectional data input/output pads).

In the write operation, the data "DATA" transferred from the SoC 200 are input to the bidirectional input/output pads P0 to P15. In the read operation, the data "DATA" to be transferred to the SoC 200 are input to the bidirectional input/output pads P0 to P15 through the read/write circuit 380.

In the write operation, depending on the complementary write clock signals buffered by the first and second write clock buffers 360A and 360B, the read/write (R/W) circuit 380 receives the data "DATA" (=DQ[15:0]) output from the bidirectional input/output pads P0 to P15 and writes the data "DATA" (=DQ[15:0]) in the memory core 390.

In the read operation, the read/write (R/W) circuit 380 sends data output from the memory core 390 to the bidirectional input/output pads P0 to P15, and the bidirectional input/output pads P0 to P15 send the data "DATA" (=DQ[15:0]) to the SoC 200 depending on the complementary write clock signals buffered by the write clock buffers 360A and 360B.

The memory core 390 includes a plurality of DRAM cells storing the data "DATA".

The first bias circuit 320A supplies a bias voltage WCK_BIAS to the first write clock buffer 360A, and the second bias circuit 320B supplies the bias voltage WCK_BIAS to the second write clock buffer 360B. Each of the first and second bias circuits 320A and 320B is also called a bias voltage generation circuit.

A structure and an operation characteristic of the first bias circuit 320A are identical to a structure and an operation characteristic of the second bias circuit 320B, and a structure and an operation characteristic of the first write clock buffer 360A is identical to a structure and an operation characteristic of the second write clock buffer 360B. The operation characteristic includes a characteristic of each transistor and a characteristic of each resistor.

In the write operation, the first write clock buffer 360A buffers the complementary write clock signals WCK_t and WCK_c input through the pads WP1 and WP2 and outputs the buffered complementary write clock signals to the bidirectional input/output pads P0 to P7.

In the write operation, the second write clock buffer 360B buffers the complementary write clock signals WCK_t and WCK_c input through the pads WP3 and WP4 and outputs the buffered complementary write clock signals to the bidirectional input/output pads P8 to P15.

The command decoder 370 decodes a first command CMDi (i=1) received through the command/address pads CP1 to CPn (n being a natural number of 2 or more) to generate a first control signal CTL1 and outputs the first control signal CTL1 to the first bias circuit 320A and the second bias circuit 320B. The first command CMD1 refers to a command determined depending on a combination of signals for initialization of the memory device 300.

The command decoder 370 decodes a second command CMDi (i=2) received through the command/address pads CP1 to CPn to generate a third control signal CTL3 and outputs the third control signal CTL3 to the first write clock buffer 360A and the second write clock buffer 360B. The second command CMD2 refers to a command determined depending on a combination of signals for the read operation or the write operation.

Below, the first bias circuit 320A and the first write clock buffer 360A will be representatively described.

Figure 3:
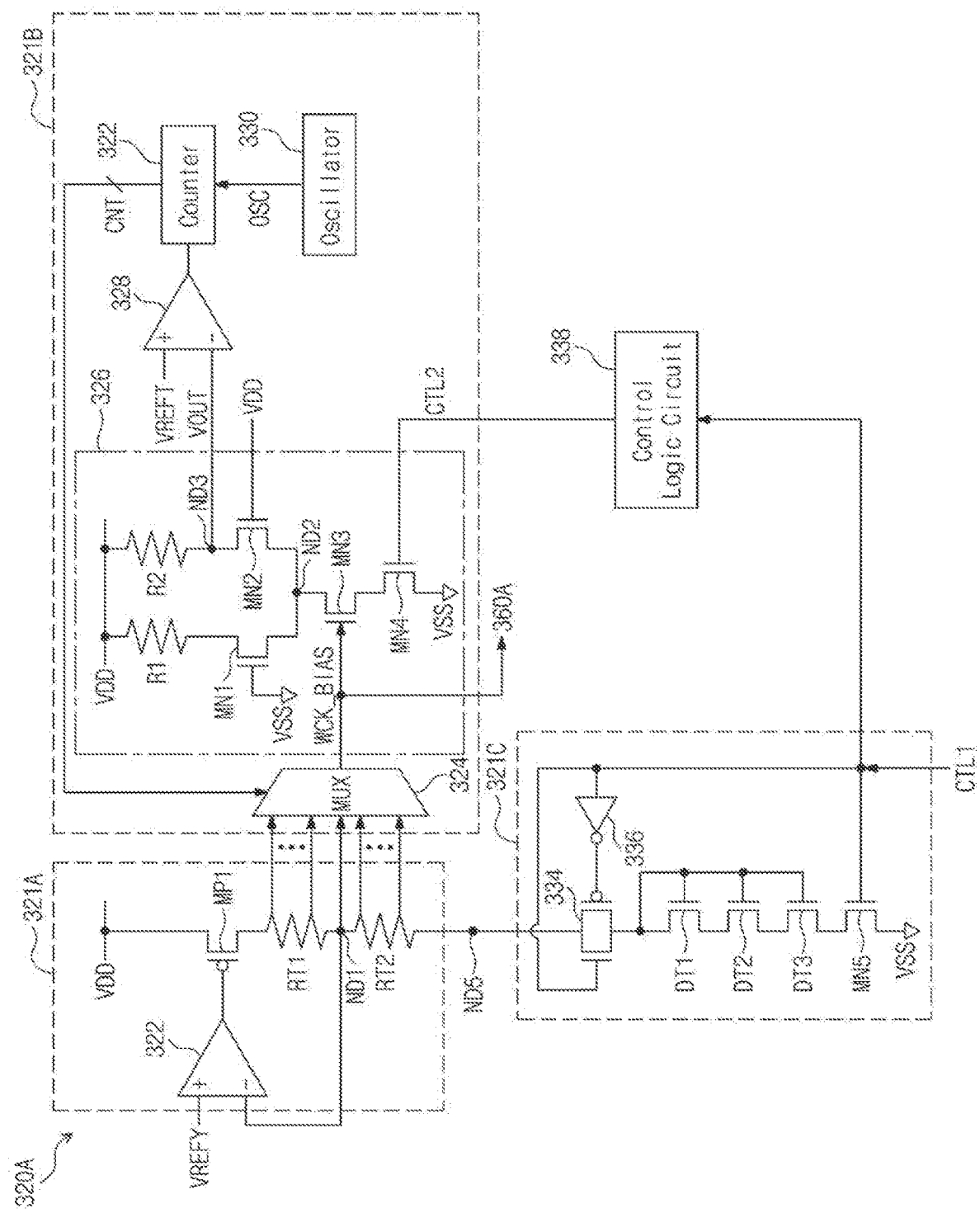
FIG. 3 is a circuit diagram of a first bias circuit illustrated in FIG. 2, according to some embodiments.

FIG. 3 is a circuit diagram a first bias circuit illustrated in FIG. 2, according to some embodiments.

Referring to FIG. 3, the first bias circuit 320A includes a voltage regulator 321A, a process calibration circuit 321B, a temperature calibration circuit 321C, and a control logic circuit 338. According to some embodiments, the process calibration circuit 321B may include the control logic circuit 338.

The voltage regulator 321A generates a plurality of voltages that are regulated to have different voltage levels. The voltage regulator 321A is connected between an operation voltage transmission line that supplies an operation voltage VDD and a current output node ND5 that supplies a current from the voltage regulator 321A to the temperature calibration circuit 321C. In some embodiments, the voltage regulator 321A may be a linear regulator, for example, a low dropout (LDO) voltage regulator and, in this configuration, the LDO voltage regulator is simply called LDO.

The voltage regulator 321A includes a first comparator 322, a first transistor MP1, a first resistor string RT1, and a second resistor string RT2.

The first comparator 322 includes a non-inverting input terminal (+) that receives a first reference voltage VREFY and an inverting input terminal (−) that receives a voltage of a first node ND1, compares the first reference voltage VREFY and the voltage of the first node ND1, and outputs a first comparison signal corresponding to a comparison result to a gate of the first transistor MP1. The first transistor MP1 may be a PMOS transistor.

For example, when the first reference voltage VREFY is equal to or greater (or higher) than the voltage of the first node ND1, the first transistor MP1 is turned off in response to the first comparison signal having a high level. When the first reference voltage VREFY is smaller (or lower) than the voltage of the first node ND1, the first transistor MP1 is turned on in response to the first comparison signal having a low level.

The first resistor string RT1 includes a first group ofresistors connected in series and is connected between a drain of the PMOS transistor MP1 and the first node ND1. When the first reference voltage VREFY is smaller than the voltage of the first node ND1, the first resistor string RT1 generates a first group of regulated voltages by dividing a voltage corresponding to a difference between a voltage of the drain of the PMOS transistor MP1 and the voltage of the first node ND1 by using the first group of resistors.

The second resistor string RT2 includes a second group of resistors connected in series and is connected between the first node ND1 and the fifth node ND5. When the first reference voltage VREFY is smaller than the voltage of the first node ND1, the second resistor string RT2 generates a second group of regulated voltages by dividing a voltage corresponding to a difference between a voltage of the first node ND1 and a voltage of the fifth node ND5 by using the second group of resistors.

The plurality of regulated voltages generated by the voltage regulator 321A include the first group of regulated voltages generated by using the first resistor string RT1 and the second group of regulated voltages generated by using the second resistor string RT2.

The process calibration circuit 321B includes a multiplexer 324, a replica write clock buffer 326, a second comparator 328, an oscillator 330, and a counter 332. The process calibration circuit 321B may also be called a close-loop digital calibration (or compensation) circuit.

The process calibration circuit 321B outputs one of the plurality of regulated voltages generated by the voltage regulator 321A as the bias voltage WCK_BIAS of the first write clock buffer 360A depending on the process variation of the semiconductor chip 300.

The process calibration circuit 321B includes the replica write clock buffer 326 including a bias transistor MN3. To calibrate or compensate for a threshold voltage of the bias transistor MN3, which changes depending on the process variation, the process calibration circuit 321B selects one of the plurality of regulated voltages generated by the voltage regulator 321A as the bias voltage WCK_BIAS by using digital signals CNT and outputs the selected bias voltage WCK_BIAS to the first write clock buffer 360A.

In more detail, the multiplexer 324 receives the plurality of regulated voltages from the voltage regulator 321A and the digital signals CNT, and outputs one of the plurality of regulated voltages from the voltage regulator 321A to a gate of the bias transistor MN3 and the first write clock buffer 360A based on the digital signals CNT from the counter 332. That is, the digital signals CNT from the counter 332 are selection signals.

Figure 5:
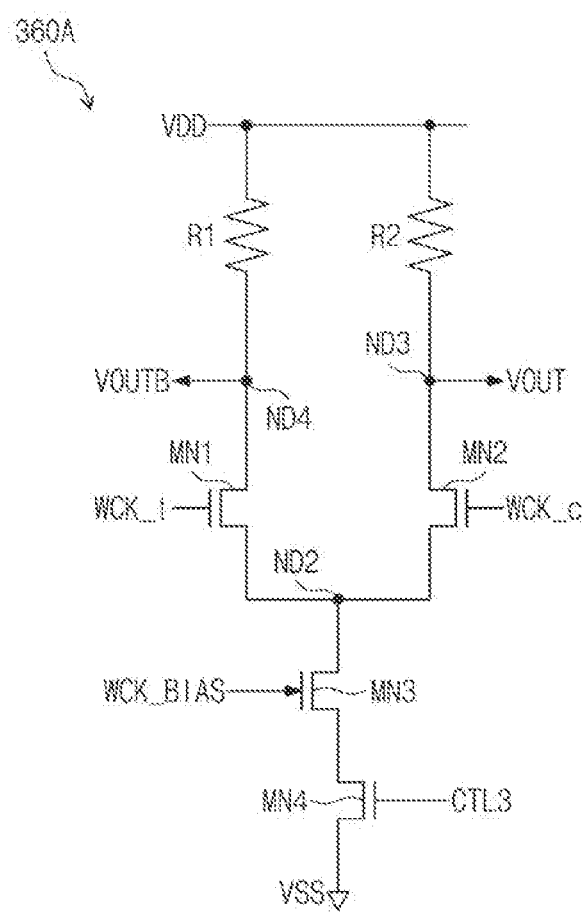
FIG. 5 is a circuit diagram of a first write clock buffer illustrated in FIG. 2, according to some embodiments.

A structure and an operation characteristic of the replica write clock buffer 326 are identical to a structure and an operation characteristic of the first write clock buffer 360A illustrated in FIG. 5.

Each of the replica write clock buffer 326 and the first write clock buffer 360A may be implemented with a current mode logic (CML) buffer.

The replica write clock buffer 326 includes a first resistor R1 and a second transistor MN1 that are connected in series between the operation voltage transmission line that supplies the operation voltage VDD and a second node ND2, a second resistor R2 and a third transistor MN2 that are connected in series between the operation voltage transmission line that supplies the operation voltage VDD and the second node ND2, and the bias transistor MN3 and an enable transistor MN4 that are connected in series between the second node ND2 and a ground VSS.

A gate of the second transistor MN1 is connected with the ground VSS, and the operation voltage VDD is supplied to a gate of the third transistor MN2. Accordingly, the second transistor MN1 implemented with an NMOS transistor is turned off, and the third transistor MN2 implemented with a NMOS transistor is turned on.

The second comparator 328 compares a second reference voltage VREFT and an output voltage VOUT of an output node ND3 of the replica write clock buffer 326 and generates a second comparison signal.

The replica write clock buffer 326 is a circuit for determining (or monitoring) how much the first write clock buffer 360A actually using the bias voltage WCK_BIAS uses a bias current at a specific bias voltage WCK_BIAS.

The second reference voltage VREFT is a voltage that is obtained by converting a target bias current into a voltage drop.

The oscillator 330 generates an oscillation signal OSC for a count operation of the counter 332. In some embodiments, the oscillator 330 may be a ring oscillator. The counter 332 generates the digital signals CNT by using an output signal of the second comparator 328 and the oscillation signal OSC. The oscillation signal OSC is also called a clock signal.

The process calibration circuit 321B uses a close loop to perform a digital calibration operation by using the oscillation signal OSC and the bias voltage WCK_BIAS that repeats up or down. The process calibration circuit 321B operates until a current of the replica write clock buffer 326 reaches the target bias current.

When the digital calibration for the bias voltage WCK_BIAS by the process calibration circuit 321B using the close loop is completed, the bias voltage WCK_BIAS is fixed to one of the plurality of regulated voltages, and the temperature calibration circuit 321C calibrates the bias voltage WCK_BIAS. That is, the bias voltage WCK_BIAS is determined by the process calibration circuit 321B only by a change of a threshold voltage of each of diode-connected transistors DT1, DT2, and DT3 (described further below).

Figure 4:
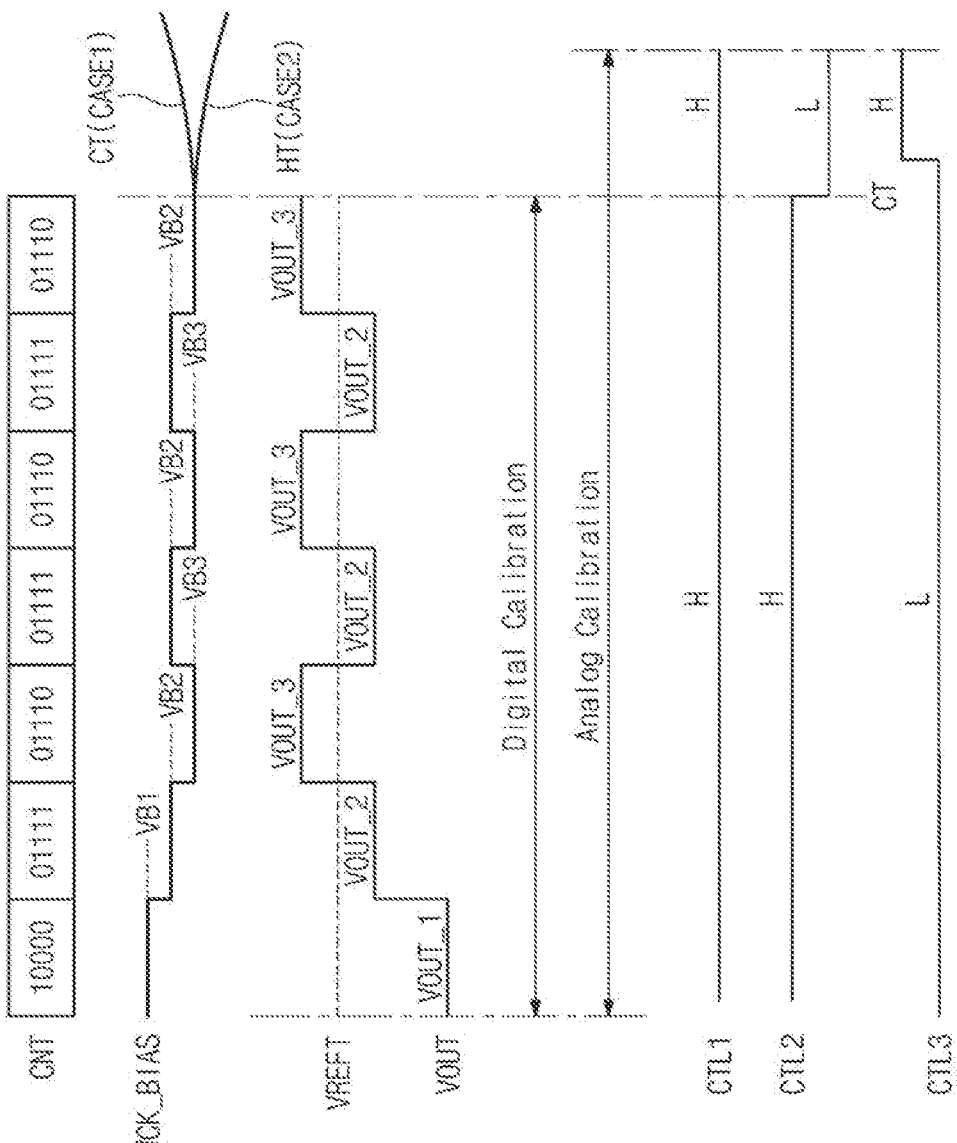
FIG. 4 is a timing diagram of signals associated with an operation of a first bias circuit illustrated in FIG. 3, according to some embodiments.

FIG. 4 is a timing diagram of signals associated with an operation of a first bias circuit illustrated in FIG. 3, according to some embodiments.

Referring to FIGS. 3 and 4, during the digital calibration operation, the enable transistor MN4 is turned on in response to a second control signal CTL2, and the amount of current flowing through the bias transistor MN3 is determined depending on a voltage level of the bias voltage WCK_BIAS. Accordingly, a level of the output voltage VOUT of the replica write clock buffer 326 is determined depending on the voltage level of the bias voltage WCK_BIAS.

It is assumed that when the digital signals CNT are first digital values (5'b10000), the multiplexer 324 outputs a first voltage (e.g., a regulated voltage having a first level VB1) among the plurality of regulated voltages as the bias voltage WCK_BIAS, in response to the first digital values (5'b10000).

Since the regulated voltage with the first level VB1 is output as the bias voltage WCK_BIAS, the level of the output voltage VOUT of the replica write clock buffer 326 is a fourth level VOUT_1.

In this case, because the fourth level VOUT_1 of the output voltage VOUT is lower than the second reference voltage VREFT, the second comparator 328 generates the second comparison signal of the high level and supplies the second comparison signal of the high level to the counter 332.

It is assumed that the counter 332 outputs the digital signals CNT having second digital values (5'b01111) depending on the second comparison signal of the high level.

It is assumed that when the digital signals CNT are the second digital values (5'b01111), the multiplexer 324 outputs a second voltage (e.g., a regulated voltage having a second level VB2) among the plurality of regulated voltages as the bias voltage WCK_BIAS, in response to the second digital values (5'b01111).

Since the regulated voltage with the second level VB2 is output as the bias voltage WCK_BIAS, the level of the output voltage VOUT of the replica write clock buffer 326 is a fifth level VOUT_2.

In this case, because the fifth level VOUT_2 of the output voltage VOUT is lower than the second reference voltage VREFT, the second comparator 328 generates the second comparison signal of the high level and supplies the second comparison signal of the high level to the counter 332.

It is assumed that the counter 332 outputs the digital signals CNT having third digital values (5'b01110) depending on the second comparison signal of the high level.

It is assumed that when the digital signals CNT are the third digital values (5'b01110), the multiplexer 324 outputs a third voltage (e.g., a regulated voltage having a third level VB3) among the plurality of regulated voltages as the bias voltage WCK_BIAS, in response to the third digital values (5'b01110). In this case, VB1>VB2>VB3.

Since the regulated voltage with the third level VB3 is output as the bias voltage WCK_BIAS, the level of the output voltage VOUT of the replica write clock buffer 326 is a sixth level VOUT_3.

In this case, because the sixth level VOUT_3 of the output voltage VOUT is higher than the second reference voltage VREFT, the second comparator 328 generates the second comparison signal of the low level and supplies the second comparison signal of the low level to the counter 332.

It is assumed that the counter 332 outputs the digital signals CNT having the second digital values (5'b01111) depending on the second comparison signal of the low level.

Operations that are performed when the digital signals CNT are the second digital value (5'b01111) and when the digital signals CNT are the third digital values (5'b01110) are identical to those described above.

As illustrated in FIG. 4 as an example, the operation in which the digital signals CNT change from the second digital value (5'b01111) to the third digital values (5'b01110) and the operation in which the digital signals CNT change from the third digital values (5'b01110) to the second digital value (5'b01111) are performed as much as the given number of times.

When the first control signal CTL1 is at the high level (H), the control logic circuit 338 receives the first control signal CTL1 of the high level, outputs the second control signal CTL2 of the high level to the enable transistor MN4 until a given time CT passes, and outputs the second control signal CTL2 of the low level (L) to the enable transistor MN4 when/after the given time CT passes.

When each of the control signals CTL1 and CTL2 is at the high level, both the process calibration circuit 321B and the temperature calibration circuit 321C are enabled. Accordingly, until the given time CT passes, the process calibration circuit 321B performs digital calibration on the bias voltage WCK_BIAS, and the temperature calibration circuit 321C performs analog calibration on the bias voltage WCK_BIAS.

However, when the given time CT passes, the second control signal CTL2 transitions (or changes) from the high level to the low level. In this case, the process calibration circuit 321B is disabled at last, and only the temperature calibration circuit 321C maintains the enable state.

The temperature calibration circuit 321C tracks a temperature variation of the semiconductor chip 300 in real time, performs analog calibration on the bias voltage WCK_BIAS from the process calibration circuit 321B in real time depending on a result of the tracking, and outputs the bias voltage WCK_BIAS on which the analog calibration have been performed to the first write clock buffer 360A.

The temperature calibration circuit 321C tracks the threshold voltage of the bias transistor MN3, which changes depending on the temperature variation of the semiconductor chip 300, in real time, and outputs the bias voltage WCK_BIAS on which the analog calibration has been performed to the first write clock buffer 360A.

The temperature calibration circuit 321C may perform analog calibration on the bias voltage WCK_BIAS in real time by using the threshold voltage of at least one diode-connected transistor DT1, DT2, or DT3. The threshold voltage is inversely proportional to the temperature variation of the semiconductor chip 300.

The temperature calibration circuit 321C is connected between the current output node ND5 of the voltage regulator 321A and the ground VSS.

The temperature calibration circuit 321C includes a switch circuit, at least one diode-connected transistor DT1, DT2, or DT3, and an enable transistor MN5.

The switch circuit connects the current output node ND5 and the at least one diode-connected transistor DT1 in response to the first control signal CTL1.

The switch circuit includes a transmission gate 334 and an inverter 336. When the first control signal CTL1 is at the high level, the transmission gate 334 is turned on. When the first control signal CTL1 is at the low level, the transmission gate 334 is turned off.

The threshold voltage of each of the plurality of diode-connected transistors DT1, DT2, and DT3 is smaller (or lower) than the threshold voltage of the bias transistor MN3 included in the replica write clock buffer 326. For example, when the threshold voltage of the bias transistor MN3 is 0.7 V, the threshold voltage of each of the diode-connected transistors DT1, DT2, and DT3 may be 0.25 V. However, embodiments are not limited thereto.

The enable transistor MN5 is an NMOS transistor, and the enable transistor MN5 is connected between the third diode-connected transistor DT3 and the ground VSS. When the first control signal CTL1 of the high level is input to a gate of the NMOS transistor MN5, the NMOS transistor MN5 is turned on, and thus, the temperature calibration circuit 321C is enabled depending on the first control signal CTL1 of the high level.

For example, each of the diode-connected transistors DT1, DT2, and DT3 has a negative temperature coefficient (NTC) characteristic.

After the first bias circuit 320A included in the semiconductor chip 300 calibrates the bias voltage WCK_BIAS by using the process calibration circuit 321B and the temperature calibration circuit 321C at a first temperature, when a temperature (or an operation temperature) of the semiconductor chip 300 decreases from the first temperature to a second temperature, the threshold voltage of each of the diode-connected transistors DT1, DT2, and DT3 increases, and an on resistance value of each of the diode-connected transistors DT1, DT2, and DT3 increases. The on resistance value is a resistance value between a drain and a source of an NMOS transistor when the NMOS transistor is turned on.

Referring to a first case CT(CASE1) of FIG. 4, because a voltage level of each of the nodes ND1 and ND5 is higher than the voltage of the non-inverting input terminal (+) of the first comparator 322, the level of the bias voltage WCK_BIAS determined by the process calibration circuit 321B increases.

However, after the first bias circuit 320A included in the semiconductor chip 300 calibrates the bias voltage WCK_BIAS by using the process calibration circuit 321B and the temperature calibration circuit 321C at the first temperature, when a temperature of the semiconductor chip 300 increases from the first temperature to a third temperature, the threshold voltage decrease each of the diode-connected transistors DT1, DT2, and DT3 decreases, and the on resistance value of each of the diode-connected transistors DT1, DT2, and DT3 decreases.

Referring to a second case HT(CASE2) of FIG. 4, because a voltage level of each of the nodes ND1 and ND5 is lower than the voltage of the non-inverting input terminal (+) of the first comparator 322, the level of the bias voltage WCK_BIAS determined by the process calibration circuit 321B decreases.

As the temperature of the semiconductor chip 300 becomes higher (HT) (i.e., as the threshold voltage of each of the diode-connected transistors DT1, DT2, and DT3 decreases), the level of the bias voltage WCK_BIAS supplied to the first write clock buffer 360A decreases (CASE2).

However, as the temperature of the semiconductor chip 300 becomes lower (CT) (i.e., as the threshold voltage of each of the diode-connected transistors DT1, DT2, and DT3 increases), the level of the bias voltage WCK_BIAS supplied to the first write clock buffer 360A increases (CASE1).

FIG. 5 is a circuit diagram of a first write clock (WCK) buffer illustrated in FIG. 2, according to some embodiments.

A structure of the first write clock buffer 360A illustrated in FIG. 5 is identical to the structure of the replica write clock buffer 326 illustrated in FIG. 3 except for signals respectively input to gates of transistors MN1, MN2, and MN4.

Referring to FIG. 5, a true write clock signal WCK_t is input to the gate of the second transistor MN1, and a complementary write clock signal WCK_c is input to the gate of the third transistor MN2.

The third control signal CTL3 is input to a gate of the enable transistor MN4 of FIG. 5. The command decoder 370 decodes the second command CMD2 and generates the third control signal CTL3 of the high level.

Each of the first and second bias circuits 320A and 320B finds the bias voltage WCK_BIAS optimized for the process variation through digital calibration using the replica write clock buffer included therein and tracks (or monitors) a change of the threshold voltage of each of the diode-connected transistors DT1, DT2, and DT3, which threshold voltage changes depending on the temperature variation while the semiconductor chip 300 operates. As such, each of the first and second bias circuits 320A and 320B may supply the constant bias voltage WCK_BIAS to each of the first and second write clock buffers 360A and 360B.

Because the first and second bias circuits 320A and 320B respectively supply the constant bias voltage WCK_BIAS to the first and second write clock buffers 360A and 360B regardless of the process variation and the temperature variation of the semiconductor chip 300, each of the first and second write clock buffers 360A and 360B buffers the complementary write clock signals WCK_t and WCK_c by using the constant bias voltage WCK_BIAS and generates buffered complementary write clock signals VOUT and VOUTB.

For example, in some embodiments, the complementary write clock signals WCK_t and WCK_c are differential write clock signals, and the buffered complementary write clock signals VOUT and VOUTB are differential write clock signals.

In the write operation and the read operation, the buffered complementary write clock signals VOUT and VOUTB that are used as a reference clock signal may be stably generated regardless of the process variation and the temperature variation, and thus, the delay variation may be minimized.

Because the first and second bias circuits 320A and 320B respectively supply the bias voltage WCK_BIAS, which is constant regardless of the process variation and the temperature variation of the semiconductor chip 300, to the first and second write clock buffers 360A and 360B, the duty ratio of each of the buffered complementary write clock signals VOUT and VOUTB is maintained at about 50% without distortion.

Figure 6:
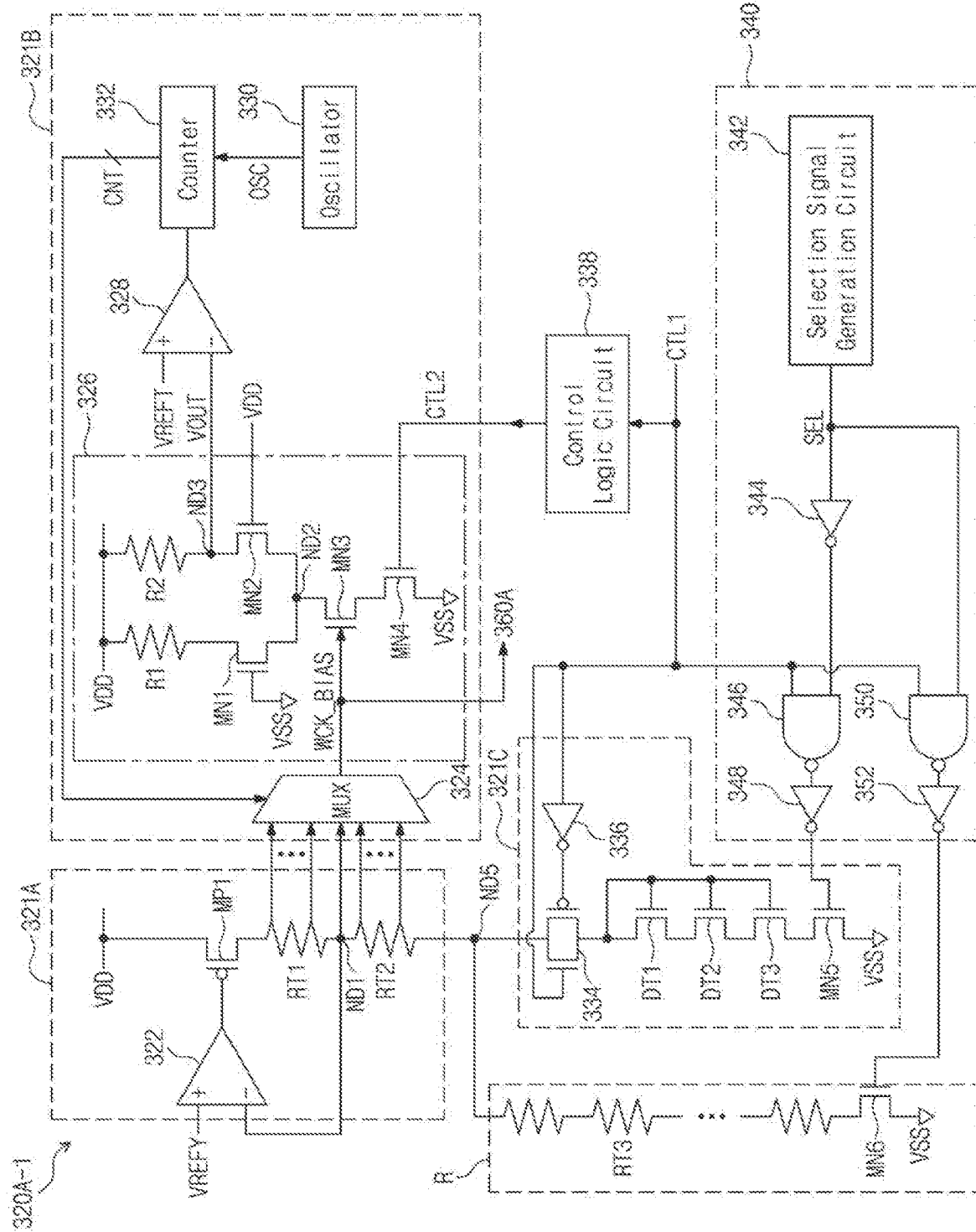
FIG. 6 is a circuit diagram of a first bias circuit illustrated in FIG. 2, according to some embodiments.

FIG. 6 is a circuit diagram of a first bias circuit illustrated in FIG. 2, according to some embodiments.

A first bias circuit 320A-1 of FIG. 6 may include the voltage regulator 321A, the process calibration circuit 321B, the temperature calibration circuit 321C, the control logic circuit 338, a resistor circuit R, and an enable control circuit 340.

A structure and an operation of each of the components 321A, 321B, 321C, and 338 of FIG. 6 is identical to the structure and the operation of each of the components 321A, 321B, 321C, and 338 of FIG. 3, and thus, repeated description associated with the components 321A, 321B, 321C, and 338 will be omitted to avoid redundancy.

The resistor circuit R includes a resistor string RT3 and an enable transistor MN6 connected in series between the current output node ND5 of the voltage regulator 321A and the ground VSS. The resistor string RT3 includes a plurality of resistors connected in series, and the enable transistor MN6 is an NMOS transistor.

The enable control circuit 340 includes a selection signal generation circuit 342, a first inverter 344, a first NAND gate circuit 346, a second inverter 348, a second NAND gate circuit 350, and a third inverter 352.

The selection signal generation circuit 342 may be implemented with a fuse and may generate a selection signal SEL corresponding to whether the fuse is cut. According to an embodiment, the selection signal generation circuit 342 may be implemented with a register.

For example, when the fuse is cut or open, the selection signal SEL has one of the high level and the low level; when the fuse is uncut or short, the selection signal SEL has the other of the high level and the low level.

The enable control circuit 340 may enable only one of the temperature calibration circuit 321C and the resistor circuit R in response to the selection signal SEL from the selection signal generation circuit 342 and the first control signal CTL1.

For example, when the first control signal CTL1 is at the high level (H) and the selection signal SEL is at the low level, the first inverter 344 outputs an output signal of the high level, the first NAND gate circuit 346 outputs an output signal of the low level by performing a NAND operation on the first control signal CTL1 of the high level and the output signal of the high level output from the first inverter 344, and the second inverter 348 outputs an output signal of the high level to the gate of the transistor MN5. In this case, the temperature calibration circuit 321C is enabled (or turned on).

However, the second NAND gate circuit 350 outputs an output signal of the high level by performing a NAND operation on the first control signal CTL1 of the high level and the output signal of the low level output from the selection signal generation circuit 342, and the third inverter 352 outputs an output signal of the low level to the gate of the transistor MN6. In this case, the resistor circuit is disabled (or turned off).

For another example, when the first control signal CTL1 is at the high level (H) and the selection signal SEL is at the high level, the first inverter 344 outputs the output signal of the low level, the first NAND gate circuit 346 outputs the output signal of the high level by performing a NAND operation on the first control signal CTL1 of the high level and the output signal of the low level output from the first inverter 344, and the second inverter 348 outputs the output signal of the low level to the gate of the transistor MN5. In this case, the temperature calibration circuit 321C is disabled (or turned off).

However, the second NAND gate circuit 350 outputs the output signal of the low level by performing a NAND operation on the first control signal CTL1 of the high level and the output signal of the high level output from the selection signal generation circuit 342, and the third inverter 352 outputs the output signal of the high level to the gate of the transistor MN6. In this case, the resistor circuit is enabled (or turned on).

Figure 7:
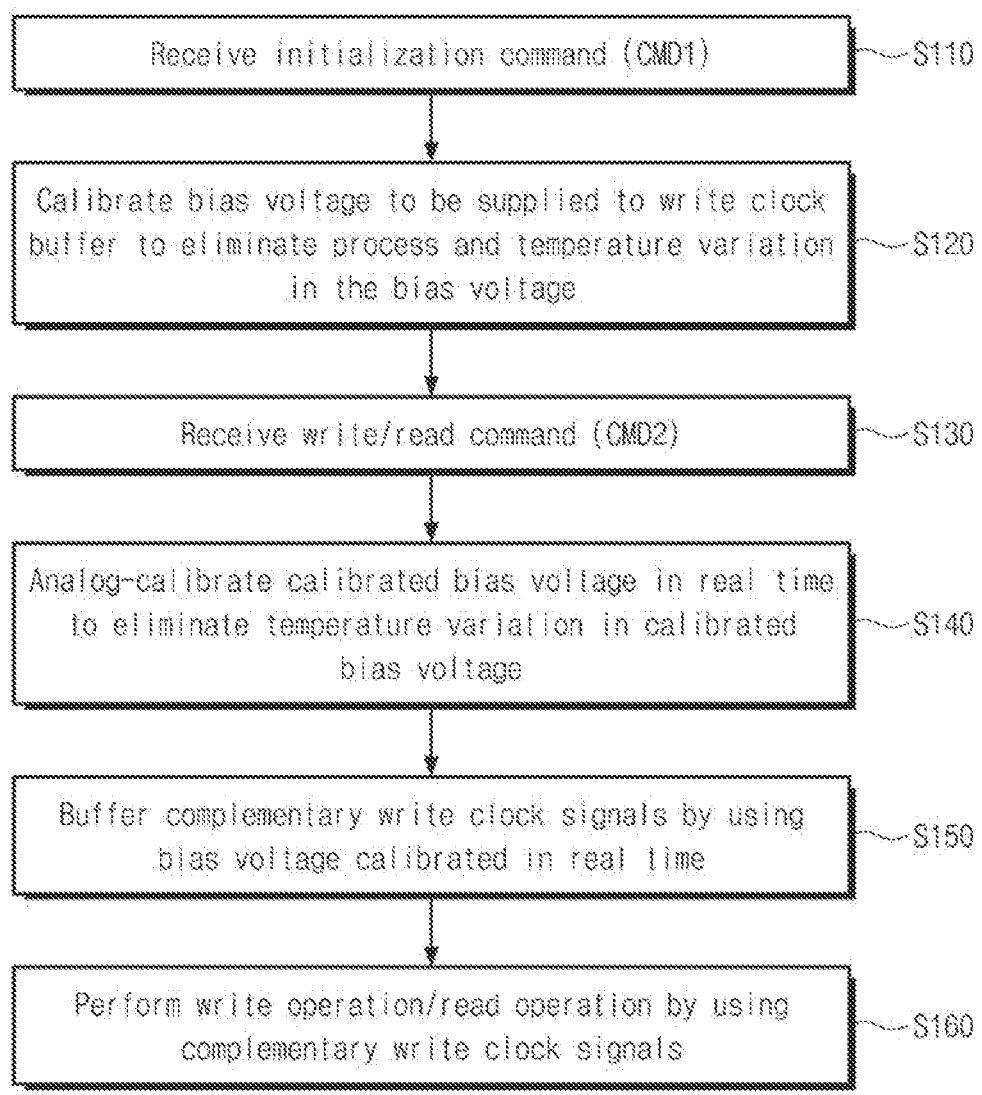
FIG. 7 is a flowchart describing an operation of a memory device illustrated in FIG. 1, according to some embodiments.

FIG. 7 is a flowchart describing an operation of a memory device illustrated in FIG. 1, according to some embodiments. Referring to FIGS. 1 to 5 and 7, the command decoder 370 receives an initialization command CMD1 (S110). The command decoder 370 generates the first control signal CTL1 of the high level (H) in response to the initialization command CMD1, and the control logic circuit 338 generates the second control signal CTL2 of the high level in response to the first control signal CTL1 of the high level.

The temperature calibration circuit 321C is enabled depending on the first control signal CTL1 of the high level, and the process calibration circuit 321B is enabled depending on the second control signal CTL2 of the high level.

The bias voltage to be supplied to the write clock buffer is calibrated to eliminate a process and a temperature variation in the bias voltage (S120). The process calibration circuit 321B calibrates the bias voltage WCK_BIAS to be supplied to the first write clock buffer 360A to remove the process variation, and simultaneously (or in parallel), the temperature calibration circuit 321C calibrates the bias voltage WCK_BIAS to be supplied to the first write clock buffer 360A to remove the temperature variation.

After the given time CT passes, because the control logic circuit 338 generates the second control signal CTL2 of the low level, the process calibration circuit 321B is disabled depending on the second control signal CTL2 of the low level.

Because the first control signal CTL1 maintains the high level even after the given time CT passes, the temperature calibration circuit 321C remains the enable state.

The command decoder 370 receives a write/read command (CMD2) (S130). Because the command decoder 370 generates the third control signal CTL3 of the high level in response to the write or read command CMD2, the first write clock buffer 360A is enabled.

According to embodiments, the write or read command CMD2 may be input to the command decoder 370 before the given time CT or after the given time CT.

The calibrated bias voltage is analog-calibrated in real time to eliminate the temperature variation in the calibrated bias voltage (S140). The temperature calibration circuit 321C performs analog calibration on the bias voltage WCK_BIAS calibrated in operation S120 in real time to remove the temperature variation and outputs the bias voltage WCK_BIAS that has undergone the analog calibration in real time to the first write clock buffer 360A.

The first write clock buffer 360A buffers the complementary write clock signals WCK_t and WCK_c by using the bias voltage WCK_BIAS in real time (S150). The first write clock buffer 360A buffers the complementary write clock signals WCK_t and WCK_c by using the bias voltage WCK_BIAS calibrated in real time in operation S140 and outputs the buffered complementary write clock signals VOUT and VOUTB to the bidirectional input/output pads P0 to P7.

A read/write operation is performed suing the complementary write clock signals (S160). When the write command CMD2 is received, the data DQ[7:0] input to the bidirectional input/output pads P0 to P7 are transferred to the read/write circuit 380 depending on the buffered complementary write clock signals VOUT and VOUTB, the read/write circuit 380 writes the data in the memory core 390.

When the read command CMD2 is received, the data read from the memory core 390 are input to the bidirectional input/output pads P0 to P7 through the read/write circuit 380, and the data input to the bidirectional input/output pads P0 to P7 are transferred to the input/output interface 240 of the SoC 200 depending on the buffered complementary write clock signals VOUT and VOUTB. For example, the term "calibration" may also be replaced with the term "compensation", "correction", "control", or "adjust".

A semiconductor chip according to some embodiments and devices including the same may perform digital calibration on a bias voltage supplied to a write clock buffer by using a bias circuit regardless of a process variation (or a process variation and a temperature variation) and may again perform analog calibration on the digitally calibrated bias voltage regardless of the temperature variation.

The semiconductor chip according to some embodiments may supply the bias voltage having a low-power and high power supply rejection ratio/power supply ripple rejection (PSRR) to the write clock buffer.

Because the semiconductor chip according to some embodiments may supply the bias voltage that does not depend on the process variation and the temperature variation to the write clock buffer, the write clock buffer may buffer complementary write clock signals by using the bias voltage and may generate buffered complementary write clock signals each having a duty ratio of 50%.

While the present disclosure has been described with reference to various embodiments thereof, it will be apparent to those of ordinary skill in the art that various changes and modifications may be made thereto without departing from the spirit and scope of the present disclosure as set forth in the following claims.

What is claimed is:

1. A semiconductor chip comprising:
 a write clock buffer;
 a voltage regulator configured to generate a plurality of regulated voltages;
 a process calibration circuit configured to output one of the plurality of regulated voltages as a bias voltage of the write clock buffer, depending on a process variation of the semiconductor chip; and
 a temperature calibration circuit configured to track a temperature variation of the semiconductor chip in real time, perform analog calibration on the bias voltage from the process calibration circuit in real time depending on a result of the tracking, and output the analog-calibrated bias voltage to the write clock buffer.

2. The semiconductor chip of claim 1, wherein the process calibration circuit includes a replica write clock buffer including a bias transistor, and the process calibration circuit is configured to output the one of the plurality of regulated voltages using digital signals such that a threshold voltage of the bias transistor is calibrated, the threshold voltage changing depending on the process variation, and
 wherein the temperature calibration circuit is configured to output the analog-calibrated bias voltage to the write clock buffer, the analog-calibrated bias voltage being inversely proportional to the temperature variation.

3. The semiconductor chip of claim 2, further comprising:
 a control logic circuit,
 wherein, while the temperature calibration circuit is enabled based on a first control signal, the control logic circuit is configured to enable the process calibration circuit based on the first control signal and disable the process calibration circuit after a given time passes following receipt of the first control signal.

4. The semiconductor chip of claim 2, wherein a structure of the write clock buffer is identical to a structure of the replica write clock buffer, and
 wherein each of the write clock buffer and the replica write clock buffer is a current mode logic buffer.

5. The semiconductor chip of claim 2, wherein the temperature calibration circuit is connected between a current output node of the voltage regulator and a ground, and includes:
 at least one diode-connected transistor;
 a switch circuit configured to connect the current output node and the at least one diode-connected transistor based on a first control signal; and
 a transistor configured to transfer a current of the at least one diode-connected transistor to the ground based on the first control signal.

6. The semiconductor chip of claim 5, wherein a threshold voltage of the at least one diode-connected transistor is lower than the threshold voltage of the bias transistor.

7. The semiconductor chip of claim 5, wherein the at least one diode-connected transistor has a negative temperature coefficient characteristic.

8. The semiconductor chip of claim 2, wherein the process calibration circuit includes:
 a multiplexer configured to output the one of the plurality of regulated voltages to a gate of the bias transistor and to the write clock buffer based on to the digital signals;
 a control logic circuit configured to generate a second control signal for enabling the replica write clock buffer based on a first control signal;
 a comparator configured to compare a reference voltage and an output signal of the replica write clock buffer and output a comparison signal; and
 a counter configured to generate the digital signals corresponding to a count value based on an oscillation signal and the comparison signal.

9. The semiconductor chip of claim 8, wherein, while the temperature calibration circuit is enabled based on the first control signal, the control logic circuit is configured to generate the second control signal, and
 wherein the second control signal that is generated is identical to the first control signal for enabling the replica write clock buffer and is different from the first control signal for disabling the replica write clock buffer.

10. A memory device comprising:
 a bias circuit configured to generate a bias voltage; and
 a write clock buffer configured to buffer complementary write clock signals based on the bias voltage and generate buffered complementary write clock signals,
 wherein the bias circuit comprises:
 a voltage regulator configured to generate a plurality of regulated voltages;
 a process calibration circuit configured to output one of the plurality of regulated voltages as the bias voltage to the write clock buffer, depending on a process variation of the memory device; and
 a temperature calibration circuit configured to track a temperature variation of the memory device in real time, perform analog calibration on the bias voltage from the process calibration circuit in real time depending on a result of the tracking, and output the analog-calibrated bias voltage to the write clock buffer.

11. The memory device of claim 10, wherein the memory device is an LPDDR DRAM.

12. The memory device of claim 10, wherein the process calibration circuit includes a replica write clock buffer including a bias transistor, and the process calibration circuit is configured to output the one of the plurality of regulated voltages as the bias voltage to the write clock buffer using digital signals such that a threshold voltage of the bias transistor is calibrated, the threshold voltage changing depending on the process variation, and wherein the temperature calibration circuit is configured to output the analog-calibrated bias voltage in real time to the write clock buffer, the analog-calibrated bias voltage being inversely proportional to the temperature variation.

13. The memory device of claim 12, further comprising:
a control logic circuit,
wherein, while the temperature calibration circuit is enabled based on a first control signal, the control logic circuit is configured to enable the process calibration circuit based on the first control signal and disable the process calibration circuit after a given time passes following receipt of the first control signal.

14. The memory device of claim 12, wherein the temperature calibration circuit includes a plurality of diode-connected transistors, and
wherein a threshold voltage of each of the plurality of diode-connected transistors is lower than the threshold voltage of the bias transistor.

15. A memory system comprising:
a memory device; and
a system on chip configured to control an operation of the memory device,
wherein the memory device comprises:
a bias circuit configured to generate a bias voltage; and
a write clock buffer configured to buffer complementary write clock signals by using the bias voltage and generate buffered complementary write clock signals, and
wherein the bias circuit comprises:
a voltage regulator configured to generate a plurality of regulated voltages;
a process calibration circuit configured to output one of the plurality of regulated voltages as the bias voltage to the write clock buffer, depending on a process variation of the memory device; and
a temperature calibration circuit configured to track a temperature variation of the memory device in real time, perform analog calibration on the bias voltage from the process calibration circuit in real time depending on a result of the tracking, and output the analog-calibrated bias voltage to the write clock buffer.

16. The memory system of claim 15, wherein the process calibration circuit includes a replica write clock buffer including a bias transistor, and the process calibration circuit is configured to output the one of the plurality of regulated voltages as the bias voltage to the write clock buffer using digital signals such that a threshold voltage of the bias transistor is calibrated, the threshold voltage changing depending on the process variation, and wherein the temperature calibration circuit is configured to output the analog-calibrated bias voltage to the write clock buffer, the analog-calibrated bias voltage being inversely proportional to the temperature variation.

17. The memory system of claim 16, further comprising:
a control logic circuit,
wherein, while the temperature calibration circuit is enabled based on a first control signal, the control logic circuit is configured to enable the process calibration circuit based on the first control signal and disable the process calibration circuit after a given time passes following receipt of the first control signal.

18. The memory system of claim 17, wherein the temperature calibration circuit is connected between a current output node of the voltage regulator and a ground, and the temperature calibration circuit includes:
at least one diode-connected transistor;
a switch circuit configured to connect the current output node o the at least one diode-connected transistor based on the first control signal; and
a transistor configured to transfer a current of the at least one diode-connected transistor to the ground based on the first control signal.

19. The memory system of claim 18, wherein a threshold voltage of the at least one diode-connected transistor is lower than the threshold voltage of the bias transistor.

20. The memory system of claim 18, further comprising:
a resistor circuit including a resistor string and a second transistor connected in series between the current output node of the voltage regulator and the ground;
a selection signal generation circuit configured to generate a selection signal; and
an enable control circuit configured to enable only one of the temperature calibration circuit and the resistor circuit based on the first control signal and the selection signal.

* * * * *